United States Patent
Tian et al.

(10) Patent No.: US 10,541,553 B2
(45) Date of Patent: Jan. 21, 2020

(54) ADAPTER AND CHARGING CONTROL METHOD

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/561,297

(22) PCT Filed: Jan. 7, 2017

(86) PCT No.: PCT/CN2017/070519
§ 371 (c)(1),
(2) Date: Sep. 25, 2017

(87) PCT Pub. No.: WO2017/133381
PCT Pub. Date: Aug. 10, 2017

(65) Prior Publication Data
US 2018/0331559 A1    Nov. 15, 2018

Related U.S. Application Data

(63) Continuation-in-part of application No. PCT/CN2016/073679, filed on Feb. 5, 2016.

(30) Foreign Application Priority Data

Jul. 26, 2016 (CN) .......................... 2016 1 0600612

(51) Int. Cl.
*H02J 7/02* (2016.01)
*G01R 31/3842* (2019.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
USPC .................................................. 320/139, 108
See application file for complete search history.

(56) References Cited

U.S. PATENT DOCUMENTS 4,087,733 A     5/1978 Casagrande
6,137,265 A    10/2000 Cummings et al.
(Continued)

FOREIGN PATENT DOCUMENTS

CN    1897394 A      1/2007
CN    202026118 U   11/2011
(Continued)

OTHER PUBLICATIONS

European Patent Application No. 17203534.7 extended Search and Opinion dated Mar. 21, 2018, 10 pages.
(Continued)

*Primary Examiner* — Edward Tso
*Assistant Examiner* — Ahmed H Omar
(74) *Attorney, Agent, or Firm* — Lathrop Gage LLP (57) ABSTRACT

An adapter, a charging control method and charging system are disclosed. The adapter includes a primary unit, a power adjustment unit and a secondary unit. The primary unit converts an input alternating current into a first current with a first pulsating waveform. The adapter is capable of operating in a constant current mode. A peak value of the first current is greater than a current value corresponding to a current limiting point of the constant current mode. The power adjustment unit samples current outputted by the adapter to obtain a current sampling value, modules the first current according to the current sampling value. The sec-
(Continued)

ondary unit converts current coupled from the primary unit to the secondary unit into the current. The current outputted by the adapter is a second current with a second pulsating waveform. A peak value of the second current is equal to the current value corresponding to the current limiting.

20 Claims, 4 Drawing Sheets

(51) Int. Cl.
    *H02M 3/335*    (2006.01)
    *H02J 7/00*    (2006.01)
    *H02J 7/04*    (2006.01)
    *H02M 7/217*    (2006.01)
    *H02J 7/06*    (2006.01)
    *H02M 1/08*    (2006.01)
    *H02M 7/06*    (2006.01)
    *H01M 10/0525*    (2010.01)
    *H01M 10/42*    (2006.01)
    *H01M 10/44*    (2006.01)
    *H02M 1/44*    (2007.01)
    *H02M 5/04*    (2006.01)
    *H02M 7/04*    (2006.01)
    *H02M 1/00*    (2006.01)
    *H02J 7/10*    (2006.01)

(52) U.S. Cl.
    CPC ......... *H01M 10/425* (2013.01); *H01M 10/44* (2013.01); *H02J 7/007* (2013.01); *H02J 7/008* (2013.01); *H02J 7/0029* (2013.01); *H02J 7/0031* (2013.01); *H02J 7/0052* (2013.01); *H02J 7/0093* (2013.01); *H02J 7/022* (2013.01); *H02J 7/04* (2013.01); *H02J 7/041* (2013.01); *H02J 7/045* (2013.01); *H02J 7/047* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 2010/4271* (2013.01); *H02J 2007/0039* (2013.01); *H02J 2007/0059* (2013.01); *H02J 2007/0062* (2013.01); *H02J 2007/0096* (2013.01); *H02J 2007/0098* (2013.01); *H02J 2007/10* (2013.01); *H02M 2001/0009* (2013.01)

(56) References Cited

U.S. PATENT DOCUMENTS

| | | | |
|---|---|---|---|
| 2004/0090209 A1 | 5/2004 | Nishida et al. | |
| 2006/0284595 A1 | 12/2006 | Hsieh et al. | |
| 2007/0229028 A1 | 10/2007 | Hashimoto | |
| 2009/0027011 A1* | 1/2009 | Umetsu ............ | H02J 7/0044 320/145 |
| 2009/0091298 A1 | 4/2009 | Bourilkov et al. | |
| 2011/0194315 A1* | 8/2011 | Gaknoki ............ | H02M 3/33507 363/21.17 |
| 2012/0086393 A1 | 4/2012 | Gray et al. | |
| 2013/0141034 A1 | 6/2013 | Huang et al. | |
| 2015/0295441 A1* | 10/2015 | Winger ............ | H02J 7/0052 320/107 |

FOREIGN PATENT DOCUMENTS

| | | |
|---|---|---|
| CN | 102545360 A | 7/2012 |
| CN | 103762702 A | 4/2014 |
| CN | 103795040 A | 5/2014 |
| CN | 204118838 U | 1/2015 |
| CN | 104810877 A | 7/2015 |
| CN | 104810879 A | 7/2015 |
| CN | 104967201 A | 10/2015 |
| CN | 106026327 A | 10/2016 |
| EP | 2887492 A2 | 6/2015 |
| EP | 2919358 A1 | 9/2015 |
| EP | 2930589 A1 | 10/2015 |
| EP | 2980958 A1 | 2/2016 |
| EP | 3131172 A1 | 2/2017 |
| JP | H11143591 A | 5/1999 |
| JP | 2001178013 A | 6/2001 |
| JP | 2010288403 A | 12/2010 |
| JP | 2011019387 A | 1/2011 |
| JP | 2013198262 A | 9/2013 |
| JP | 5454781 B2 | 3/2014 |
| TW | M481439 U | 7/2014 |
| TW | 201524105 A | 6/2015 |
| TW | M507117 U | 8/2015 |
| TW | 201535930 A | 9/2015 |
| TW | 201626677 A | 7/2016 |
| WO | WO 2012167677 A1 | 12/2012 |
| WO | WO 2014194811 A1 | 12/2014 |
| WO | WO 2015113341 A1 | 8/2015 |
| WO | WO 2015113349 A1 | 8/2015 |
| WO | WO 2016013451 A1 | 1/2016 |
| WO | WO 2016074458 A1 | 5/2016 |

OTHER PUBLICATIONS

Japanese Patent Application No. 2017557134 Office Action dated Mar. 13, 2018, 6 pages.
Japanese Patent Application No. 2017557134 English translation of Office Action dated Mar. 13, 2018, 8 pages.
Taiwan Patent Application No. 106124337 Office Action dated Apr. 10, 2018, 16 pages.
PCT/CN2017/070519 English translation of the International Search Report dated Apr. 13, 2017, 4 pages.
Australian Patent Application No. 2016291545 Office Action dated Jun. 25, 2018, 6 pages.
European Patent Application No. 16819788.7 extended Search and Opinion dated Nov. 15, 2017, 7 pages.
Korean Patent Application No. 20177002310 Office Action dated Jan. 29, 2018, 5 pages.
Korean Patent Application No. 20177002310 English translation of Office Action dated Jan. 29, 2018, 3 pages.
Korean Patent Application No. 20177002310 Office Action dated Jun. 26, 2018, 3 pages.
Korean Patent Application No. 20177002310 English translation of Office Action dated Jun. 26, 2018, 3 pages.
Singapore Patent Application No. 11201700428U Search and Opinion dated Nov. 23, 2017, 9 pages.
Taiwan Patent Application No. 105120040 Office Action dated Aug. 8, 2017, 11 pages.
Taiwan Patent Application No. 105120040 Decision to Grant Patent dated Mar. 22, 2018, 2 pages.
PCT/CN2016/073679 International Search Report and Written Opinion dated Nov. 10, 2016, 12 pages.
PCT/CN2016/073679 English translation of International Search Report and Written Opinion dated Nov. 10, 2016, 8 pages.
Chen, Liang-Rui, 'A Design of an Optimal Battery Pulse Charge System by Frequency-Varied Technique', IEEE Transactions on Industrial Electronics, vol. 54, No. 1, Feb. 2007, pp. 398-405, cited in office action in AU application No. 2016291545.
Japanese Patent Application No. 2018-140376 Office Action dated Apr. 23, 2019, 5 pages.
Japanese Patent Application No. 2018-140376 English translation of Office Action dated Apr. 23, 2019, 4 pages.
Indian Patent Application No. 201737037092 Office Action dated Nov. 11, 2019, 5 pages.

* cited by examiner

| a bidirectional communication is performed with the device to be charged so as to control output of the second adapter in the second charging mode when the second adapter is coupled to the device to be charged | 710 |

Fig. 7

ADAPTER AND CHARGING CONTROL METHOD

CROSS-REFERENCE TO RELATED APPLICATIONS

This application is a US national phase application of International Application No. PCT/CN2017/070519, filed on Jan. 7, 2017, which claims priority to International Application No. PCT/CN2016/073679, filed on Feb. 5, 2016, and Chinese Patent Application No. 201610600612.3, filed on Jul. 26, 2016, the entire contents of which are incorporated herein by reference.

TECHNICAL FIELD

Embodiments of the present disclosure generally relate to charging field, and more particularly, to an adapter and a charging control method.

BACKGROUND

An adapter, also called as a power adapter, is configured to charge a device to be charged (e.g. a terminal). Currently, the adapter on the market charges the device to be charged in a constant voltage mode. As a battery of the device to be charged is a lithium battery generally, if the device to be charged is charged under constant voltage, it may easily lead to lithium precipitation thereby reducing a service lifespan of the battery.

SUMMARY

Embodiments of the present disclosure provide an adapter and a charging control method, so as to reduce lithium precipitation of a battery and improve a service lifespan of the battery.

Embodiments of the present disclosure provide an adapter. The adapter includes a primary unit, a power adjustment unit and a secondary unit. The primary unit is configured to convert an input alternating current into a first current with a first pulsating waveform. The adapter is configured to be capable of operating in a constant current mode. A peak value of the first current is greater than a current value corresponding to a current limiting point of the constant current mode. The power adjustment unit is configured to sample current outputted by the adapter to obtain a current sampling value and to module the first current according to the current sampling value. The secondary unit is configured to convert current coupled from the primary unit to secondary unit into the current outputted by the adapter. The current outputted by the adapter is a second current with a second pulsating waveform. A peak value of the second current is equal to the current value corresponding to the current limiting point of the constant current mode.

Embodiments of the present disclosure provide a charging control method. The method is applied in the adapter according to the first aspect. The adapter is configured to support a first charging mode and a second charging mode. A charging speed of the adapter in the second charging mode is faster than that in the first charging mode. The adapter is configured to charge the device to be charged by using a constant current mode in the second charging mode. The method includes: performing a bidirectional communication with the device to be charged so as to control output of the adapter in the second charging mode when the adapter is coupled to the device to be charged.

BRIEF DESCRIPTION OF THE DRAWINGS

In order to make the technical solutions of embodiments of the present disclosure more clearly, the accompanying drawings used in the description of embodiments of the present disclosure are briefly described hereunder. Obviously, the described drawings are merely some embodiments of present disclosure. For those skilled in the art, other drawings may be obtained based on these drawings without any creative work.

DETAILED DESCRIPTION

The technical solutions in embodiments of the present disclosure are hereinafter described clearly and completely with reference to the accompanying drawings in embodiments of the present disclosure. It should be understood that, embodiments described herein are a part of embodiments of the present disclosure, but not all. Based on embodiments of the present disclosure, all other embodiments obtained by those skilled in the art without creative work should fall within the scope of the present disclosure.

A first adapter, configured to charge a device to be charged (e.g. a terminal), is mentioned in the related art. The first adapter operates in a constant voltage mode. In the constant voltage mode, voltage outputted by the first adapter is constant basically, such as 5V, 9V, 12V or 20V, etc.

The voltage outputted by the first adapter is not suitable for being directly applied to two ends of a battery, but needs to be converted by a conversion circuit in the device to be charged (e.g. the terminal), so as to obtain a charging voltage and/or charging current expected by the battery in the device to be charged (e.g. the terminal).

The conversion circuit is configured to convert the voltage outputted by the first adapter, so as to meet requirements for the charging voltage and/or the charging current expected by the battery.

As an example, the conversion circuit may refer to a charging management module, e.g. a charging integrated circuit (IC). In a process of charging the battery, the charging management module is configured to manage the charging voltage and/or the charging current of the battery. The conversion circuit has functions of a voltage feedback module and/or functions of a current feedback module, so as to realize management on the charging voltage and/or the charging current of the battery.

For example, the process of charging the battery may include one or more of a trickle charging stage, a constant current charging stage and a constant voltage charging stage. In the trickle charging stage, the conversion circuit can utilize a current feedback loop to make current flowing into the battery satisfy the charging current (e.g. first charging current) expected by the battery. In the constant current charging stage, the conversion circuit can utilize the current feedback loop to make the current flowing into the battery satisfy the charging current (e.g. second charging current, the second charging current is greater than the first charging current) expected by the battery. In the constant voltage charging stage, the conversion circuit can utilize a voltage feedback loop to make voltage applied to two ends of the battery satisfy the charging voltage expected by the battery.

As an example, when the voltage outputted by the first adapter is greater than the charging voltage expected by the battery, the conversion circuit is configured to perform a voltage reduction processing on the voltage outputted by the first adapter, such that a charging voltage obtained after the voltage reduction processing satisfies the requirement for the charging voltage expected by the battery. As another example, when the voltage outputted by the first adapter is less than the charging voltage expected by the battery, the conversion circuit is configured to perform a voltage increment processing on the voltage outputted by the first adapter, such that a charging voltage obtained after the voltage increment processing satisfies the requirement for the charging voltage expected by the battery.

As a further example, when the first adapter outputs a constant voltage of 5V and the battery includes a single battery cell (taking lithium battery cell as an example, a charging cut-off voltage of the single battery cell is 4.2V), the conversion circuit (e.g. a buck circuit) may perform the voltage reduction processing on the voltage outputted by the first adapter, such that the charging voltage obtained after the voltage reduction processing satisfies the requirement for the charging voltage expected by the battery.

As a further example, when the first adapter outputs a constant voltage of 5V and the first adapter charges two or more single battery cells in series (taking lithium battery cell as an example, a charging cut-off voltage of the single battery cell is 4.2V), the conversion circuit (e.g. boost circuit) may perform the voltage increment processing on the voltage outputted by the first adapter, such that the charging voltage obtained after the voltage increment processing satisfies the requirement for the charging voltage expected by the battery.

Limited by a poor conversion efficiency of the conversion circuit, an unconverted part of electric energy is dissipated in a form of heat. The heat may gather inside the device to be charged (e.g. the terminal). A design space and a cooling space of the device to be charged (e.g. the terminal) both are small (e.g. a physical size of a mobile terminal used by a user becomes thinner and a number of electronic components are arranged in the mobile terminal to enhance performance of the mobile terminal), which not only enhances design difficulty of the conversion circuit, but also leads to that the heat gathered inside the device to be charged (e.g. the terminal) is difficult to dissipate, thus further causing an abnormity of the device to be charged (e.g. the terminal).

For example, heat accumulated on the conversion circuit may cause thermal interference to electronic components near the conversion circuit, thereby causing abnormal operations of the electronic components. For another example, heat accumulated on the conversion circuit may shorten service lifespans of the conversion circuit and electronic components near the conversion circuit. For another example, heat accumulated on the conversion circuit may cause thermal interference to the battery, thereby leading to abnormal charging and discharging of the battery. For another example, heat accumulated on the conversion circuit may cause temperature of the device to be charged (e.g. the terminal) to increase, thereby affecting user experience when charging. For another example, heat accumulated on the conversion circuit may short-circuit the conversion circuit, such that the voltage outputted by the first adapter is directly applied to two ends of the battery, thus causing an over-voltage charging of the battery. If the over-voltage charging lasts for a long time period, battery explosion may be caused, thereby endangering user's safety.

Embodiments of the present disclosure provide a second adapter with adjustable output voltage. The second adapter is capable of acquiring battery status information. The battery status information may include electric quantity information and/or voltage information of the battery. The second adapter is configured to adjust the voltage outputted by itself according to the acquired battery status information, so as to meet the requirement for the charging voltage and/or the charging current expected by the battery. Further, in the constant current charging stage of the process of charging the battery, the voltage outputted by the second adapter after adjustment can be directly applied to two ends of the battery to charge the battery.

The second adapter has functions of a voltage feedback module and functions of a current feedback module, so as to realize management on the charging voltage and/or the charging current of the battery.

The second adapter may adjust the voltage outputted by itself according to the acquired battery status information as follows. The second adapter may acquire the battery status information in real time and adjust the voltage outputted by itself according to the battery status information acquired in real time, so as to meet the charging voltage and/or the charging current expected by the battery.

The second adapter may adjust the voltage outputted by itself according to the battery status information acquired in real time as follows. With the rising of the battery voltage during the charging process, the second adapter may acquire the battery status information at different moments during the charging process, and adjust the voltage outputted by itself in real time according to the battery status information, so as to meet the requirements for charging voltage and/or the charging current expected by the battery.

For example, the process of charging the battery may include one or more of a trickle charging stage, a constant current charging stage and a constant voltage charging stage. In the trickle charging stage, the second adapter can utilize a current feedback loop to make current outputted by the second adapter and flowing into the battery satisfies requirements of the charging current (e.g. the first charging current) expected by the battery. In the constant current charging stage, the second adapter can utilize the current feedback loop to make the current outputted by the second adapter and flowing into the battery satisfies requirements of the charging current (e.g. the second charging current, the second charging current may be greater than the first charging current) expected by the battery. Moreover, in the constant current charging stage, the second adapter can directly applies the outputted charging voltage to two ends of the battery for charging the battery. In the constant voltage charging stage, the second adapter can utilize a voltage feedback loop to make voltage outputted by the second adapter satisfies requirements of the charging voltage expected by the battery.

For the trickle charging stage and the constant voltage charging stage, the voltage outputted by the second adapter may be processed in a similar manner as that employed by the first adapter. That is, the voltage outputted by the second adapter may be converted by the conversion circuit in the device to be charged (e.g. the terminal), so as to acquire the charging voltage and/or the charging current expected by the battery in the device to be charged (e.g. the terminal).

Figure 1:
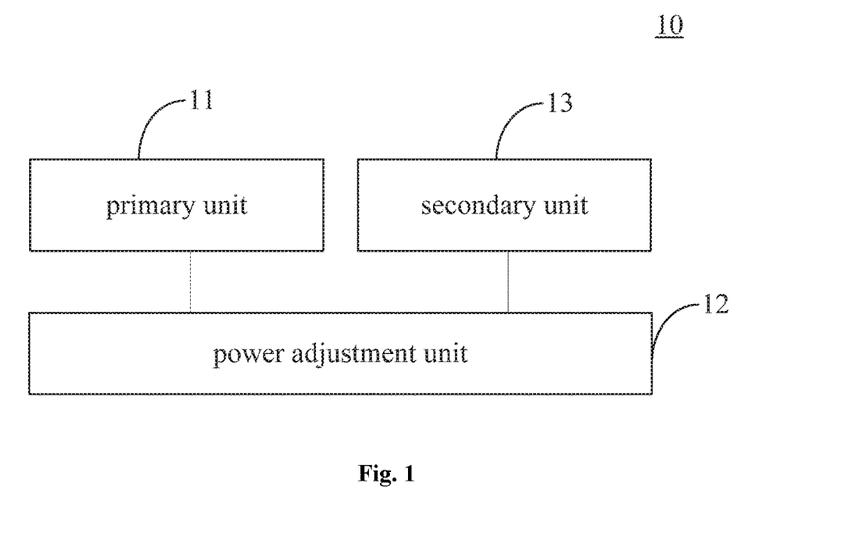
FIG. 1 is a block diagram of a second adapter according to an embodiment of the present disclosure.

FIG. 1 is a block diagram of a second adapter according to embodiments of the present disclosure. The second adapter illustrated in FIG. 1 may include a primary unit 11, a power adjustment unit 12 and a secondary unit 13.

The primary unit 11 is configured to convert an input alternating current into a first current with a first pulsating waveform. The second adapter 10 is configured to be capable of operating in a constant current mode. A peak value of the first current is greater than a current value corresponding to a current limiting point (or called as a present current limiting point) of the constant current mode.

The power adjustment unit 12 is configured to sample current outputted by the second adapter 10 to obtain a current sampling value and to module the first current according to the current sampling value.

The secondary unit 13 is configured to convert current coupled from the primary unit 11 to the secondary unit 12 into the current outputted by the second adapter 10. The current outputted by the second adapter 10 is a second current with a second pulsating waveform. A peak value of the second current is equal to the current value corresponding to the current limiting point of the constant current mode.

In other words, the second current is configured as the charging current outputted by the second adapter 10 for charging the device to be charged (e.g. the terminal). This charging current may charge the battery intermittently. A cycle of this charging current varies with a frequency of the power grid. In some embodiments, a frequency corresponding to the cycle of this charging current may be an integer multiple or a fraction of the frequency of the power grid. In other words, this charging current can charge the battery intermittently. In some embodiments, this charging current may be formed of one pulse or a set of pulses synchronous to the power grid.

The current outputted by the second adapter in embodiments of the present disclosure, is a current with a pulsating waveform (i.e. pulsating direct current). The current with the pulsating waveform may reduce the lithium precipitation of the battery, reduce probability and intensity of arc at a contact of a charging interface, and improve a service lifespan of the charging interface.

In detail, the power adjustment unit 12 may include a current sampling unit coupled to the secondary unit 13. The current sampling unit is configured to sample the current outputted by the second adapter 10 to acquire a current sampling value, and to send a control signal to a pulse width modulation (PWM) controller according to correspondences between current sampling values and current values corresponding to the current limiting point, so as to adjust a duty cycle of a PWM signal outputted by the PWM controller, thereby realizing modulation on the first current.

Figure 2A:
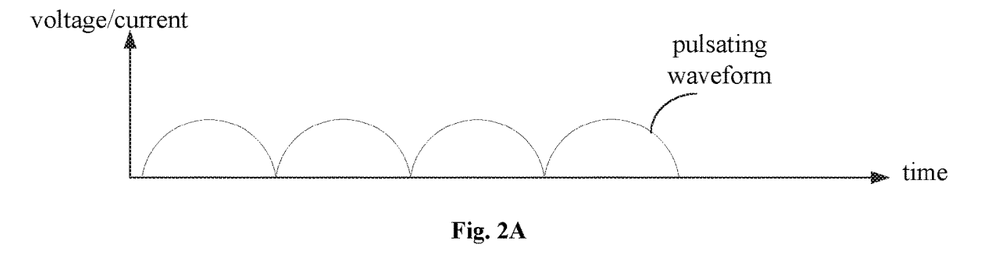
FIGS. 2A and 2B are schematic diagrams illustrating pulsating waveforms according to embodiments of the present disclosure.
Figure 2B:
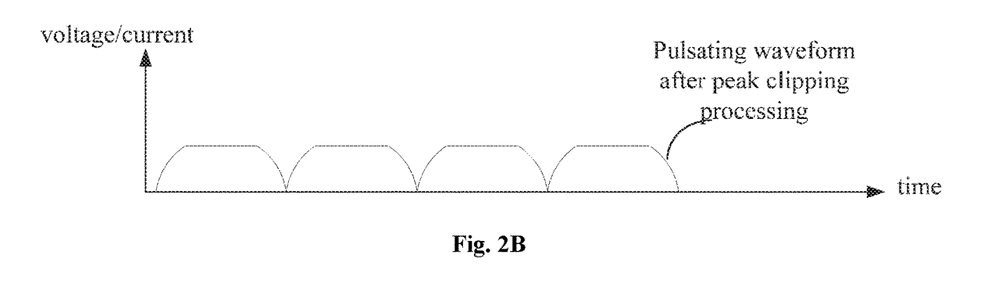

The pulsating waveform in the present disclosure can be a complete pulsating waveform or can be a pulsating waveform obtained after performing a peak clipping processing on a complete pulsating waveform. The peak clipping processing may refer to that a part of the pulsating waveform that exceeds a certain threshold is filtered out, thereby realizing a control on a peak value of the pulsating waveform. In an embodiment illustrated in FIG. 2A, the pulsating waveform is a complete pulsating waveform. In an embodiment illustrated in FIG. 2B, the pulsating waveform is a pulsating waveform after the peak clipping processing.

A method for limiting a peak value of the second pulsating waveform is not particularly limited in embodiments of the present disclosure.

In some embodiments, the above second pulsating waveform may be a complete pulsating waveform. For example, a peak value of the second current is controlled at a current value corresponding to a current limiting point via the power adjustment unit 12, under the premise of ensuring the second pulsating waveform to be complete.

In some embodiments, the above second pulsating waveform is a pulsating waveform acquired after the peak clipping processing.

Figure 3:
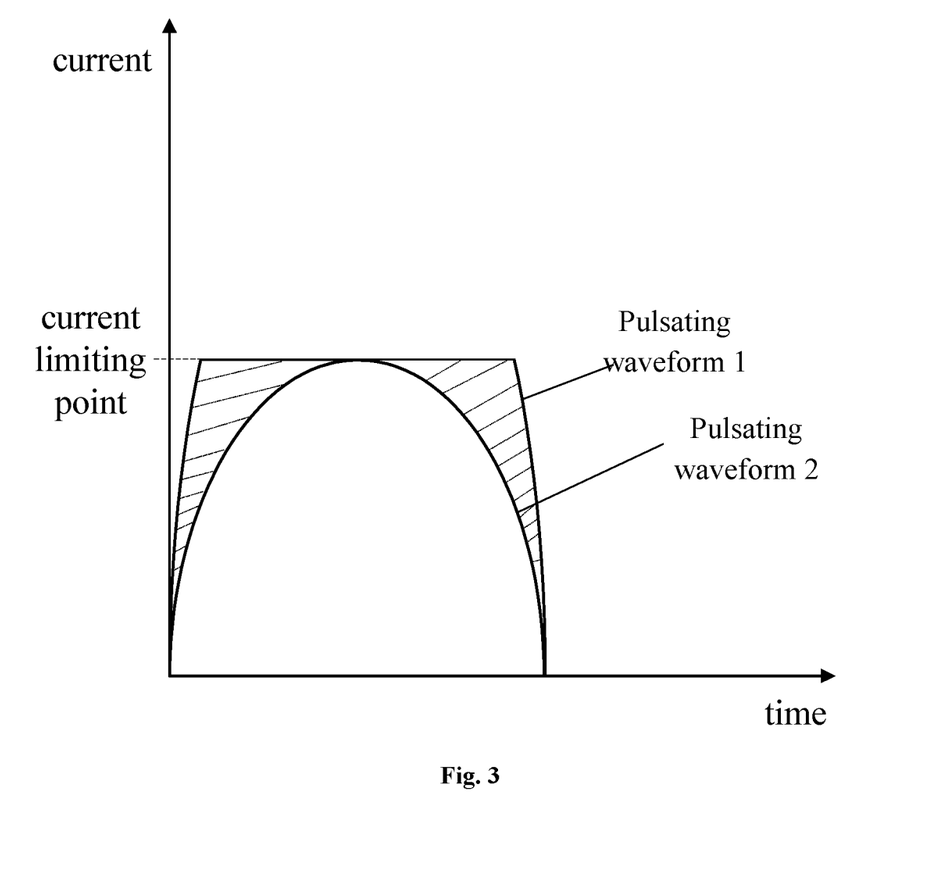
FIG. 3 is a schematic diagram illustrating different pulsating waveforms according to embodiments of the present disclosure.

As illustrated in FIG. 3, the pulsating waveform 2 is a complete pulsating waveform and the pulsating waveform 1 is a pulsating waveform acquired after the peak clipping processing. When the device to be charged (e.g. the terminal) is charged both by using the current with those two kinds of pulsating waveforms, it may reduce the lithium precipitation of the battery, thereby improving charging safety. However, an area enclosed by the pulsating waveform 1 and the time axis is larger than an area enclosed by the pulsating waveform 2 and the time axis (a sum of the area enclosed by the pulsating waveform 2 and the time axis and a shaded area is equal to the area enclosed by the pulsating waveform 1 and the time axis). Since a charging efficiency (or speed) of the second adapter is proportional to an area enclosed by the pulsating waveform and the time axis, the larger the area enclosed by the pulsating waveform and the time axis is, the higher the charging efficiency is. Therefore, the efficiency for charging the device to be charged (e.g. the terminal) using the current with the pulsating waveform 1 is greater than the efficiency for charging the device to be charged (e.g. the terminal) using the current with the pulsating waveform 2.

Therefore, in embodiments of the present disclosure, the peak clipping processing on the pulsating waveform not only ensures that the peak value of the current outputted by the second adapter is equal to the current value corresponding to the current limiting point, but also improves charging efficiency.

Figure 4:
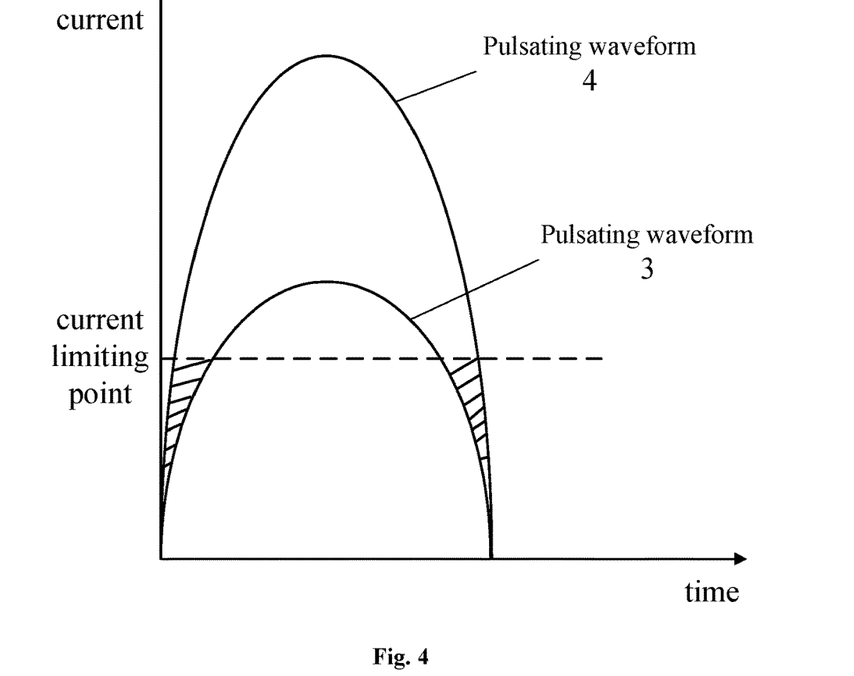
FIG. 4 is a schematic diagram illustrating different pulsating waveforms according to embodiments of the present disclosure.
Figure 5:
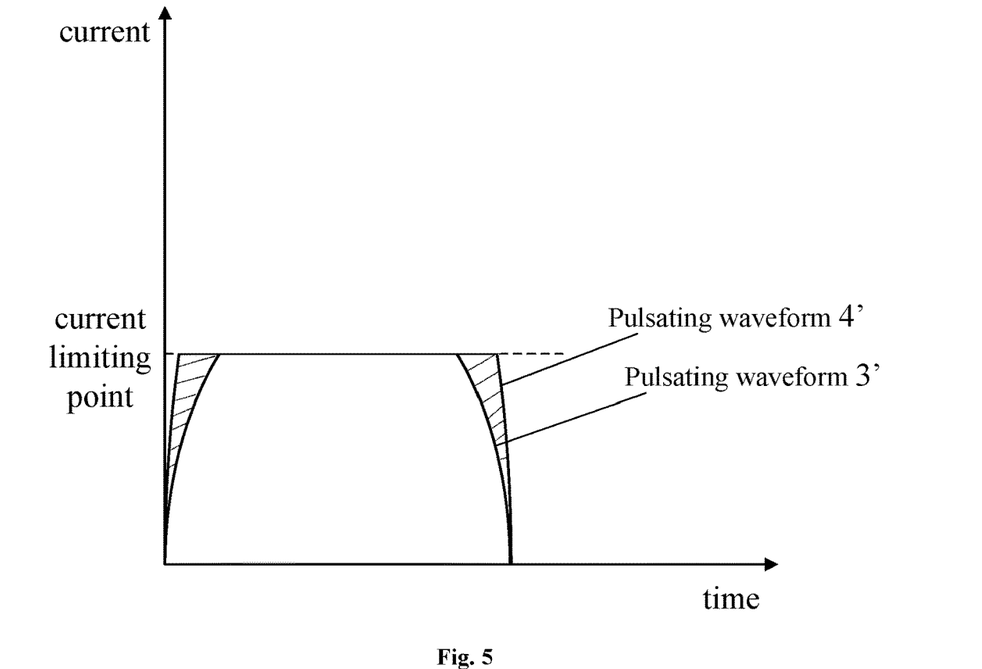
FIG. 5 is a schematic diagram illustrating different pulsating waveforms according to embodiments of the present disclosure.

Further, taking FIG. 4 and FIG. 5 as an example, the pulsating waveform 3 and the pulsating waveform 4 in FIG. 4 are pulsating waveforms before the peak clipping processing, and a peak value of the pulsating waveform 3 is less than a peak value of the pulsating waveform 4. The pulsating waveform 3' in FIG. 5 is a pulsating waveform acquired by performing the peak clipping processing on the pulsating waveform 3 in FIG. 4. The pulsating waveform 4' in FIG. 5 is a pulsating waveform acquired by performing the peak clipping processing on the pulsating waveform 4 in FIG. 4. In FIG. 5, an area enclosed by the pulsating waveform 4' and the time axis is equal to a sum of an area enclosed by the pulsating waveform 3' and the time axis and a shaded area. The area enclosed by the pulsating waveform 4' and the time axis is larger than the area enclosed by the pulsating waveform 3' and the time axis. Therefore, the current with the pulsating waveform 4' is more efficient for charging the device to be charged (e.g. the terminal).

That is, the higher the peak value of the pulsating waveform before the peak clipping processing is, the higher the charging efficiency of the current with the pulsating waveform obtained after the peak clipping processing is. Therefore, the charging efficiency may be improved by increasing the peak value of the pulsating waveform before the peak clipping processing.

There are several ways to increase the peak value of the pulsating waveform. For example, a PWM controller with a higher maximum duty cycle is selected to increase the peak value of the pulsating waveform, or inductance of a transformer is increased to increase the peak value of the pulsating waveform.

A method for outputting the second current by the second adapter is not limited specifically in embodiments of the present disclosure. For example, a primary filter unit in the primary unit 11 and a secondary filter unit in the secondary unit 13 may be removed to form the second current, which not only allows the second adapter 10 to output the second current, but also reduces drastically a size of the second adapter 10, thus facilitating miniaturization of the second adapter 10.

In some embodiments, the second adapter 10 is configured to support a first charging mode and a second charging mode. A charging speed at which the second adapter 10 charges the device to be charged (e.g. the terminal) in the second charging mode is faster than a charging speed at which the second adapter 10 charges the device to be charged (e.g. the terminal) in the first charging mode. In other words, the second adapter 10 operating in the second charging mode can fully charge the device to be charged (e.g. the terminal) with the same capacity in a shorter time, compared to the second adapter 10 operating in the first charging mode.

The second adapter 10 includes a control unit. The control unit is configured to perform a bidirectional communication with the device to be charged (e.g. the terminal) so as to control a charging process of the second charging mode, when the second adapter 10 is coupled to the device to be charged (e.g. the terminal).

The first charging mode is a normal charging mode and the second charging mode is a fast charging mode. Under the normal charging mode, the second adapter outputs a relatively small current (typically less than 2.5 A) or charges a battery of the device to be charged (e.g. the terminal) with a relatively small power (typically less than 15 W). In the normal charging mode, it may take several hours to fully charge a larger capacity battery (such as a battery with 3000 mAh). Under the fast charge mode, the second adapter outputs a relatively large current (typically greater than 2.5 A, such as 4.5 A, 5 A or higher) or charges the battery of the device to be charged (e.g. the terminal) with a relatively large power (typically greater than or equal to 15 W). Compared to the normal charging mode, the charging speed of the second adapter in the fast charging mode is faster, and the charging time required for fully charging a battery with a same capacity in the fast charging mode may be significantly shortened.

Content communicated between the control unit of the second adapter and the device to be charged (e.g. the terminal) is not limited in embodiments of the present disclosure. Also, a manner of controlling output of the second adapter in the second charging mode by the control unit is not limited in embodiments of the present disclosure. For example, the control unit may communicate with the device to be charged (e.g. the terminal) to acquire interactively present voltage or present electric quantity of the battery in the device to be charged (e.g. the terminal) and adjust the voltage or the current outputted by the second adapter based on the present voltage or the present electric quantity of the battery. The content communicated between the control unit and the device to be charged (e.g. the terminal) and the manner of controlling the output of the second adapter in the second charging mode by the control unit are described in detail below with reference to specific embodiments.

In some embodiments, when the control unit performs the bidirectional communication with the device to be charged (e.g. the terminal) so as to control the output of the second adapter in the second charging mode, the control unit is configured to perform the bidirectional communication with the device to be charged (e.g. the terminal) so as to negotiate about a charging mode between the second adapter and the device to be charged (e.g. the terminal).

In embodiments of the present disclosure, the second adapter does not employ the second charging mode to perform fast charging on the device to be charged (e.g. the terminal) blindly but needs to perform the bidirectional communication with the device to be charged (e.g. the terminal) to negotiate whether the second adapter can perform fast charging on the device to be charged (e.g. the terminal) in the second charging mode. Therefore, the safety of the charging process is improved.

In detail, when the control unit performs the bidirectional communication with the device to be charged (e.g. the terminal) so as to negotiate about the charging mode between the second adapter and the device to be charged (e.g. the terminal), the control unit is configured to send a first instruction to the device to be charged (e.g. the terminal), to receive a first reply instruction sent by the device to be charged (e.g. the terminal) and to charge the device to be charged (e.g. the terminal) in the second charging mode when the device to be charged (e.g. the terminal) agrees to start the second charging mode. The first instruction is configured to query the device to be charged (e.g. the terminal) whether to start the second charging mode. The first reply instruction is configured to indicate whether the device to be charged (e.g. the terminal) agrees to start the second charging mode.

Master-slave relationship between the second adapter (or the control unit of the second adapter) and the device to be charged (e.g. the terminal) is not limited in the above description of the embodiments of the present disclosure. In other words, any one of the control unit and the device to be charged (e.g. the terminal) may be configured as a master device initiating a bidirectional communication session, while the other of the control unit and the device to be charged (e.g. the terminal) may be configured as a slave device making a first response or a first reply to the communication initiated by the master device. As a feasible way, during the communication process, identities of the master device and the slave device may be confirmed by comparing an electrical level of the second adapter and an electrical level of the device to be charged (e.g. the terminal) with respect to ground.

A specific implementation of the bidirectional communication between the second adapter (or the control unit of the second adapter) and the device to be charged (e.g. the terminal) is not limited in embodiments of the present disclosure. In other words, any one of the second adapter (or the control unit of the second adapter) and the device to be charged (e.g. the terminal) may be configured as a master device initiating a communication session, and accordingly the other of the second adapter (or the control unit of the second adapter) and the device to be charged (e.g. the terminal) may be configured as a slave device making a first response or a first reply to the communication session initiated by the master device, while the master device may make a second response to the first response or the first reply of the slave device, i.e. it is considered that one negotiation about the charging mode has completed between the master device and the slave device. As a possible implementation, the charging operation may be performed between the master device and the slave device after multiple negotiations about the charging mode are completed between the master device and the slave device, such that the charging process after the negotiation can be executed safely and reliably.

As an implementation, the master device makes the second response to the first response or the first reply made by the slave device to the communication session in a manner that, the master device may receive the first response or the first reply made by the slave device to the communication session and make the second response according to the received first response or the received first reply of the slave device. For example, when the master device receives the first response or the first reply made by the slave device to the communication session within a preset time period, the master device may make the second response to the first response or the first reply of the slave device in a manner that, one negotiation about the charging mode is completed between the master device and the slave device, and the charging operation may be performed between the master device and the slave device in the first charging mode or the second charging mode according to a negotiation result, i.e. the second adapter operates in the first charging mode or the second charging mode according to the negotiation result for charging the device to be charged (e.g. the terminal).

As another implementation, the master device makes the second response to the first response or the first reply made by the slave device to the communication session in a manner that, the master device does not receive the first response or the first reply made by the slave device to the communication session within the preset time period and the master device also makes the second response to the first response or the first reply of the slave device. For example, when the master device does not receive the first response or the first reply made by the slave device to the communication session within the preset time period, the master device makes the second response to the first response or the first reply of the slave device in a manner that, one negotiation about the charging mode is completed between the master device and the slave device, and the charging operation may be performed between the master device and the slave device in the first charging mode, i.e. the second adapter operates in the first charging mode for charging the device to be charged (e.g. the terminal).

In some embodiments, when the device to be charged (i.e. the terminal) configured as a master device initiates a communication session, after the second adapter (or the control unit of the second adapter) configured as a slave device makes the first response or the first reply to the communication session initiated by the master device, the second adapter (or the control unit of the second adapter) does not need a second response to a first response or a first reply from the device to be charged (i.e. the terminal), one negotiation about the charging mode is regarded as completed between the master device and the slave device, and the second adapter operates in the first charging mode or the second charging mode according to the negotiation result for charging the device to be charged (e.g. the terminal).

In some embodiments, when the control unit performs the bidirectional communication with the device to be charged (e.g. the terminal) so as to control the output of the second adapter in the second charging mode, the control unit is configured to perform the bidirectional communication with the device to be charged (e.g. the terminal) so as to determine a charging voltage outputted by the second adapter in the second charging mode for charging the device to be charged (e.g. the terminal); and to adjust voltage outputted by the second adapter, such that the voltage outputted by the second adapter (or a peak value of the voltage outputted by the second adapter) is equal to the charging voltage outputted by the second adapter in the second charging mode for charging the device to be charged (e.g. the terminal).

In detail, the control unit performs the bidirectional communication with the device to be charged (e.g. the terminal) so as to determine the charging voltage outputted by the second adapter in the second charging mode for charging the device to be charged (e.g. the terminal) as follows. The control unit sends a second instruction to the device to be charged (e.g. the terminal) and receives a second reply instruction sent by the device to be charged (e.g. the terminal). The second instruction is configured to query whether the voltage outputted by the second adapter is suitable for the present voltage of a battery of the device to be charged (e.g. the terminal). The second reply instruction is configured to indicate that the voltage outputted by the second adapter is suitable, high, or low. In an embodiment, the second instruction is configured to query whether the present voltage outputted by the second adapter is suitable for being used as the charging voltage outputted by the second adapter in the second charging mode for charging the device to be charged (e.g. the terminal). The second reply instruction is configured to indicate that the present voltage outputted by the second adapter is suitable, high or low. When the present voltage (or a peak value) outputted by the second adapter is suitable for the present voltage of the battery, or the present voltage (or a peak value) outputted by the second adapter is suitable for being used as the charging voltage outputted by the second adapter in the second charging mode for charging the device to be charged (e.g. the terminal), the present voltage (or the peak value) outputted by the second adapter is slightly higher than the present voltage of the battery and a difference between the present voltage outputted by the second adapter and the present voltage of the battery is within a preset range (usually in a magnitude of several hundreds of mill volts).

In some embodiments, when the control unit performs the bidirectional communication with the device to be charged (e.g. the terminal) so as to control the output of the second adapter in the second charging mode, the control unit is configured to perform the bidirectional communication with the device to be charged (e.g. the terminal) so as to determine a charging current outputted by the second adapter in the second charging mode for charging the device to be charged (e.g. the terminal); and to adjust current (or a peak value of the current) outputted by the second adapter, such that the current (or the peak value of the current) outputted by the second adapter is equal to the charging current outputted by the second adapter in the second charging mode for charging the device to be charged (e.g. the terminal).

In detail, the control unit performs the bidirectional communication with the device to be charged (e.g. the terminal) so as to determine the charging current outputted by the second adapter in the second charging mode for charging the device to be charged (e.g. the terminal) as follows. The control unit sends a third instruction to the device to be charged (e.g. the terminal), receives a third reply instruction sent by the device to be charged (e.g. the terminal), and determines the charging current outputted by the second adapter in the second charging mode for charging the device to be charged (e.g. the terminal) according to a maximum charging current supported by the device to be charged (e.g. the terminal). The third instruction is configured to query the maximum charging current supported by the device to be charged (e.g. the terminal). The third reply instruction is configured to indicate the maximum charging current supported by the device to be charged (e.g. the terminal). It will be appreciated that, there are several manners of determining the charging current outputted by the second adapter in the second charging mode for charging the device to be charged (e.g. the terminal) by the control unit according to the maximum charging current supported by the device to be charged (e.g. the terminal). For example, the second adapter determines the maximum charging current supported by the device to be charged (e.g. the terminal) as the charging current (or a peak value of the charging current) outputted by the second adapter in the second charging mode for charging the device to be charged (e.g. the terminal), or determines the charging current outputted by the second adapter in the second charging mode for charging the device to be charged (e.g. the terminal) after considering factors such as the maximum charging current supported by the device to be charged (e.g. the terminal) and the its own current output capability.

In some embodiments, when the control unit performs the bidirectional communication with the device to be charged (e.g. the terminal) so as to control the output of the second adapter in the second charging mode, the control unit is configured to perform the bidirectional communication with the device to be charged (e.g. the terminal) so as to adjust the current outputted by the second adapter during a process that the second adapter charges the device to be charged (e.g. the terminal) in the second charging mode.

In detail, the control unit performs the bidirectional communication with the device to be charged (e.g. the terminal) so as to adjust the current outputted by the second adapter as follows. The control unit sends a fourth instruction to the device to be charged (e.g. the terminal), receives a fourth reply instruction sent by the device to be charged (e.g. the terminal) and adjusts the current outputted by the second adapter according to a present voltage of a battery of the device to be charged (e.g. the terminal). The fourth instruction is configured to query the present voltage of the battery of the device to be charged (e.g. the terminal). The fourth reply instruction is configured to indicate the present voltage of the battery of the device to be charged (e.g. the terminal).

Figure 6A:
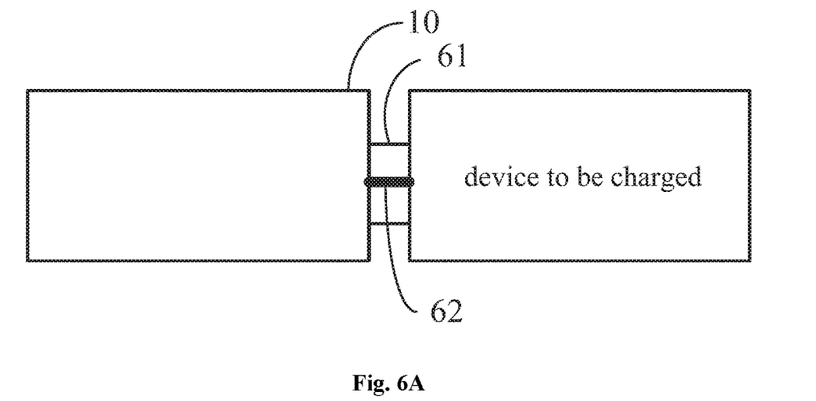
FIG. 6A is a schematic diagram illustrating a coupling mode between a second adapter and a device to be charged according to embodiments of the present disclosure.

In some embodiments, as illustrated in FIG. 6A, the second adapter 10 may further include a charging interface 61. Further, in some embodiments, the control unit in the second adapter 10 is configured to perform the bidirectional communicate with the device to be charged (e.g. the terminal) via a data wire 62 of the charging interface 61.

In some embodiments, when the control unit performs the bidirectional communication with the device to be charged (e.g. the terminal) so as to control the output of the second adapter in the second charging mode, the control unit is configured to perform the bidirectional communication with the device to be charged (e.g. the terminal) so as to determine whether there is a poor contact at the charging interface.

In detail, the control unit performs the bidirectional communication with the device to be charged (e.g. the terminal) so as to determine whether there is the poor contact at the charging interface as follows. The control unit sends a fourth instruction to the device to be charged (e.g. the terminal), receives a fourth reply instruction sent by the device to be charged (e.g. the terminal), and determines whether there is the poor contact at the charging interface according to the voltage outputted by the second adapter and the present voltage of the battery of the device to be charged (e.g. the terminal). The fourth instruction is configured to query the present voltage of the battery in the device to be charged (e.g. the terminal). The fourth reply instruction is configured to indicate the present voltage of the battery in the device to be charged (e.g. the terminal). For example, when the control unit determines that a difference between the voltage outputted by the second adapter and the present voltage of the device to be charged (e.g. the terminal) is greater than a preset voltage threshold, it indicates that an impedance that is acquired by dividing the difference by the value of the current outputted by the second adapter is greater than a preset impedance threshold and it is determined that there is the poor contact at the charging interface.

In some embodiments, the poor contact at the charging interface may be determined by the device to be charged (e.g. the terminal) as follows. The device to be charged (e.g. the terminal) sends a sixth instruction to the control unit, receives a sixth reply instruction sent by the control unit, and determines whether there is the poor contact at the charging interface according to the voltage outputted by the second adapter and the present voltage of the battery of the device to be charged (e.g. the terminal). The sixth instruction is configured to query the voltage outputted by the second adapter. The sixth fourth reply instruction is configured to indicate the voltage outputted by the second adapter. After the device to be charged (e.g. the terminal) determines there is the poor contact at the charging interface, the device to be charged (e.g. the terminal) sends a fifth instruction to the control unit, in which the fifth instruction is configured to indicate that there is the poor contact at the charging interface. After the control unit receives the fifth instruction, the control unit may control the second adapter to quit the second charging mode.

Figure 6B:
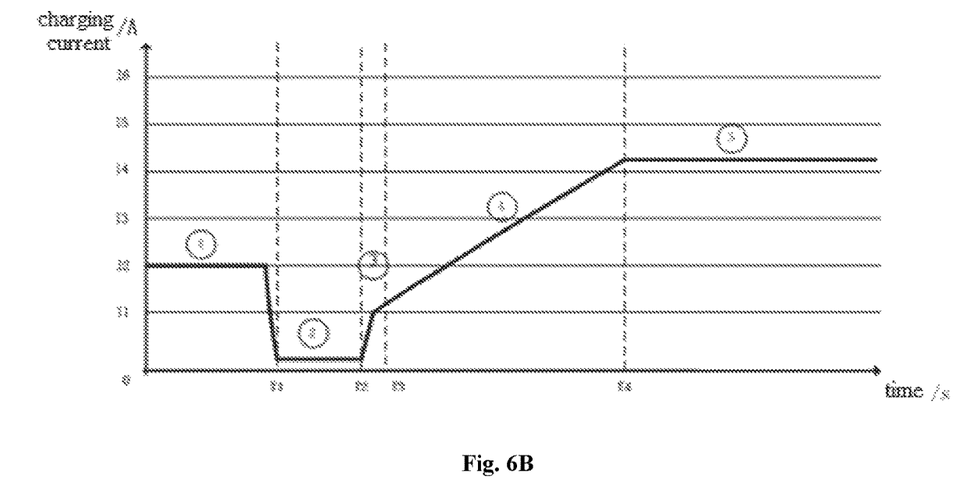
FIG. 6B is a schematic diagram illustrating a fast charging communication process according to embodiments of the present disclosure.

The communication process between the control unit in the second adapter and the device to be charged (e.g., terminal) will be described in more detail with reference to FIG. 6B. In an embodiment, examples of FIG. 6B are merely used for purpose of assisting those skilled in the art in understanding embodiments of the present disclosure, and not used for limiting embodiments of the present disclosure to specific numerical or specific scenes illustrated. It will be apparent to those skilled in the art that various modifications or variations may be made by those skilled in the art in view of the illustrated examples of FIG. 6B, and such modifications or variations are within the scope of the embodiments of the present disclosure.

As illustrated in FIG. 6B, the charging process that the output of the second adapter in the second charging mode charges the device to be charged (e.g. the terminal) may include five stages.

Stage 1:

After the device to be charged (e.g. the terminal) is coupled to a power supply providing device, the device to be charged (e.g. the terminal) may detect a type of the power supply providing device via the data wire D+ and D−. When detecting that the power supply providing device is the second adapter, the device to be charged (e.g. the terminal) may absorb current greater than a predetermined current threshold 12, such as 1 A. When the control unit in the second adapter detects that the current outputted by the second adapter is greater than or equal to 12 within a predetermined time period (such as a continuous time period T1), the control unit determines that the device to be charged (e.g. the terminal) has completed the recognition of the type of the power supply providing device. The control unit initiates a negotiation between the second adapter and the device to be charged (e.g. the terminal), and sends an instruction 1 (corresponding to the above-mentioned first instruction) to the device to be charged (e.g. the terminal), so as to query whether the device to be charged (e.g. the terminal) agrees that the second adapter charges the device to be charged (e.g. the terminal) in the second charging mode.

When the control unit receives a reply instruction of the instruction 1 from the device to be charged (e.g. the terminal), and the reply instruction of the instruction 1 indicates that the device to be charged (e.g. the terminal) disagrees that the second adapter charges the device to be charged (e.g. the terminal) in the second charging mode, the control unit detects the current outputted by the second adapter again. When the current outputted by the second adapter is still greater than or equal to 12 within a predetermined continuous time period (such as a continuous time period T1), the control unit sends the instruction 1 to the device to be charged (e.g. the terminal) again, so as to query whether the device to be charged (e.g. the terminal) agrees that the second adapter charges the device to be charged (e.g. the terminal) in the second charging mode. The above actions in stage 1 are repeated by the control unit, until the device to be charged (e.g. the terminal) agrees that the second adapter charges the device to be charged (e.g. the terminal) in the second charging mode or the current outputted by the second adapter is no longer greater than or equal to 12.

After the device to be charged (e.g. the terminal) agrees that the second adapter charges the device to be charged (e.g. the terminal) in the second charging mode, the communication procedure goes into stage 2.

Stage 2:

For the voltage outputted by the second adapter, there may be several levels. The control unit sends an instruction 2 (corresponding to the above-mentioned second instruction) to the device to be charged (e.g. the terminal) to query whether the voltage (i.e. the present output voltage) outputted by the second adapter matches to the present voltage of the battery of the device to be charged (e.g. the terminal).

The device to be charged (e.g. the terminal) sends a reply instruction of the instruction 2 to the control unit, for indicating that the voltage outputted by the second adapter is suitable, higher, or lower for the present voltage of the battery of the device to be charged (e.g. the terminal). If the reply instruction of the instruction 2 indicates that the voltage outputted by the second adapter is higher or lower, the control unit adjusts the voltage outputted by the second adapter by one level and sends the instruction 2 to the device to be charged (e.g. the terminal) again to query whether the voltage outputted by the second adapter matches to the present voltage of the battery of the device to be charged (e.g. the terminal). The above actions in stage 2 are repeated, until the device to be charged (e.g. the terminal) determines that the voltage outputted by the second adapter matches to the present voltage of the battery of the device to be charged (e.g. the terminal). And then the procedure goes into stage 3.

Stage 3:

The control unit sends an instruction 3 (corresponding to the above-mentioned third instruction) to the device to be charged (e.g. the terminal) to query the maximum charging current supported by the device to be charged (e.g. the terminal). The device to be charged (e.g. the terminal) sends a reply instruction of the instruction 3 to the control unit, for indicating the maximum charging current supported by the device to be charged (e.g. the terminal) and the procedure goes into stage 4.

Stage 4:

The control unit determines the charging current outputted by the second adapter in the second charging mode for charging the device to be charged (e.g. the terminal) according to the maximum charging current supported by the device to be charged (e.g. the terminal) and the procedure goes into stage 5, i.e. the constant current charging stage.

Stage 5:

When the procedure goes into the constant current charging stage, the control unit sends an instruction 4 (corresponding to the above-mentioned fourth instruction) to the device to be charged (e.g. the terminal) at intervals to query the present voltage of the battery in the device to be charged (e.g. the terminal). The device to be charged (e.g. the terminal) may send a reply instruction of the instruction 4 to the control unit, so as to feedback the present voltage of the battery in the device to be charged (e.g. the terminal). The control unit may determine according to the present voltage of the battery whether there is a poor contact at the charging interface and whether it is necessary to decrease the current outputted by the second adapter. When the second adapter determines that there is the poor contact at the charging interface, it sends an instruction 5 (corresponding to the above-mentioned fifth instruction) to the device to be charged (e.g. the terminal), and then the second adapter quits the second charging mode and then the procedure is reset and goes into stage 1 again.

In some embodiments, in stage 1, when the device to be charged (e.g. the terminal) sends the reply instruction of the instruction 1, the reply instruction of the instruction 1 may carry data (or information) on the path impedance of the device to be charged (e.g. the terminal). The data on the path impedance of the device to be charged (e.g. the terminal) may be used in stage 5 to determine whether there is the poor contact at the charging interface.

In some embodiments, in stage 2, the time period from when the device to be charged (e.g. the terminal) agrees that the second adapter charges the device to be charged (e.g. the terminal) in the second charging mode to when the control unit adjusts the voltage outputted by the second adapter to a suitable value may be limited in a certain range. If the time period exceeds a predetermined range, the second adapter or the device to be charged (e.g. the terminal) may determine that the fast communication process is abnormal, thus the procedure is reset and goes into stage 1.

In some embodiments, in stage 2, when the voltage outputted by the second adapter has a value higher than the present voltage of the battery of the device to be charged (e.g. the terminal) by $\Delta V$ ($\Delta V$ is set to be about 200-500 mV), the device to be charged (e.g. the terminal) may send the reply instruction of the instruction 2 to the control unit, for indicating that the voltage outputted by the second adapter matches to the voltage of the battery of the device to be charged (e.g. the terminal).

In some embodiments, in stage 4, the adjusting speed of the current outputted by the second adapter may be controlled to be in a certain range, thus avoiding an abnormity occurring in the charging process due to the too fast adjusting speed.

In some embodiments, in stage 5, the variation degree of the current outputted by the second adapter may be controlled to be within 5%.

In some embodiments, in stage 5, the control unit may monitor the path impedance of a charging circuit in real time. The control unit may monitor the path impedance of the charging circuit according to the voltage and the current outputted by the second adapter, and the present voltage of the battery fed back by the device to be charged (e.g. the terminal). When the path impedance of the charging circuit>the path impedance of the device to be charged (e.g. the terminal)+the impedance of the charging wire, it may be considered that there is the poor contact at the charging interface, and the second adapter stops charging the device to be charged (e.g. the terminal) in the second charging mode.

In some embodiments, after the second adapter starts to charge the device to be charged (e.g. the terminal) in the second charging mode, a time interval of communications between the control unit and the device to be charged (e.g. the terminal) may be controlled to be within a certain range, thus avoiding abnormal communication process due to the too short time interval.

In some embodiments, termination of the charging process (or termination of the charging process that the second adapter charges the charging device (e.g. the terminal) in the second charging mode) may include a recoverable termination and an unrecoverable termination.

For example, when the device to be charged (e.g. the terminal) detects that the battery is fully charged or there is the poor contact at the charging interface, the charging process is stopped and the charging communication procedure is reset, and the charging process goes into stage 1 again. When the device to be charged (e.g. the terminal) disagrees that the second adapter charges the device to be charged (e.g. the terminal) in the second charging mode, the charging communication procedure would not go into stage 2. In this case, the termination of the charging process may be considered as an unrecoverable termination.

For another example, when an abnormity occurs in the communication between the device to be charged (e.g. the terminal) and the control unit, the charging process is stopped and the charging communication procedure is reset, and the charging process goes into stage 1 again. After requirements for stage 1 are met, the device to be charged (e.g. the terminal) agrees that the second adapter charges the device to be charged (e.g. the terminal) in the second charging mode to recover the charging process. In this case, the termination of the charging process may be considered as a recoverable termination.

For another example, when the device to be charged (e.g. the terminal) detects that an abnormity occurs in the battery, the charging process is stopped and reset, and the charging process goes into stage 1 again. The device to be charged disagrees that the adapter charges the device to be charged (e.g. the terminal) in the second charging mode. When the battery returns to normal and the requirements for stage 1 are met, the device to be charged (e.g. the terminal) agrees that the adapter charges the device to be charged (e.g. the terminal) in the second charging mode. In this case, the termination of fast charging process may be considered as a recoverable termination.

Communication actions or operations illustrated in FIG. 6B are merely exemplary. For example, in stage 1, after the device to be charged (e.g. the terminal) is coupled to the second adapter, the handshake communication between the device to be charged (e.g. the terminal) and the second adapter may be initiated by the device to be charged (e.g. the terminal). In other words, the device to be charged (e.g. the terminal) sends an instruction 1 to query the control unit whether to start the second charging mode. When the device to be charged (e.g. the terminal) receives a reply instruction of the control unit, and the reply instruction indicates that the control unit agrees that the second adapter charges the device to be charged (e.g. the terminal) in the second charging mode, the second adapter starts to charge the device to be charged (e.g. the terminal) in the second charging mode.

For example, after stage 5, there is a constant voltage charging stage. In other words, in stage 5, the device to be charged (e.g. the terminal) may feedback the present voltage of the battery to the control unit. As the present voltage of the battery reaches a constant voltage charging voltage threshold, the charging process enters into the constant voltage charging stage from the constant current charging stage. During the constant voltage charging stage, the charging current decreases gradually. When the current reduces to a certain threshold, the charging process is stopped and it illustrates that the battery of the device to be charged (e.g. the terminal) is fully charged.

In some embodiments, the second adapter applies the current outputted by the second adapter to two ends of the battery of the device to be charged (e.g. the terminal) directly, so as to realize a direct charging of the battery.

In detail, the direct charging may refer to that, the voltage and the current outputted by the second adapter may be directly applied (or directly be introduced) to two ends of the battery of the device to be charged (e.g. the terminal), so as to charge the battery of the device to be charged (e.g. the terminal). No conversion unit is required to convert the voltage and the current outputted by the second adapter, thus avoiding energy loss caused by the conversion process. In order to be able to adjust the charging voltage or the charging current on the charging circuit during the charging process in the second charging mode, the second adapter can be designed as an intelligent adapter, and the second adapter completes the conversion of the charging voltage or the charging current, which may reduce burden of the device to be charged (e.g. the terminal) and reduce the amount of heat of the device to be charged (e.g. the terminal).

The second adapter 10 in embodiments of the present disclosure may operate in a constant current mode. The constant current mode herein refers to a charging mode in which the current outputted by the second adapter may be controlled but the current outputted by the second adapter needs not to keep constant. In practice, the second adapter in the constant current mode usually employs the multi-stage constant current mode for charging.

The multi-stage constant current charging has N charging stages (N is an integer not less than 2). The first charging stage of the multi-stage constant current charging starts with a predetermined charging current. The N charging stages of the multi-stage constant current charging may be performed sequentially from the first charging stage to the $(N-1)^{th}$ charging stage. When the constant current charging is switched from one charging stage to a next charging stage, the charging current value becomes small. When the voltage of the battery reaches the charging stop voltage threshold, the constant current charging is switched from the present charging stage to the next charging stage.

Further, in the case where the current outputted by the second adapter is the pulsating direct current, the constant current mode may refer to a charging mode in which a peak value or a mean value of the pulsating direct current is controlled, i.e. the peak value of the current outputted by the second adapter is controlled to not exceed the current corresponding to the constant current mode.

The embodiments of the present disclosure are described in detail with reference to FIGS. 1 to 6, and method embodiments of the present disclosure will be described in detail below with reference to FIG. 7. It is to be understood that the description on the method side corresponds to the description on the device side and duplicate description is omitted for concise.

Figure 7:
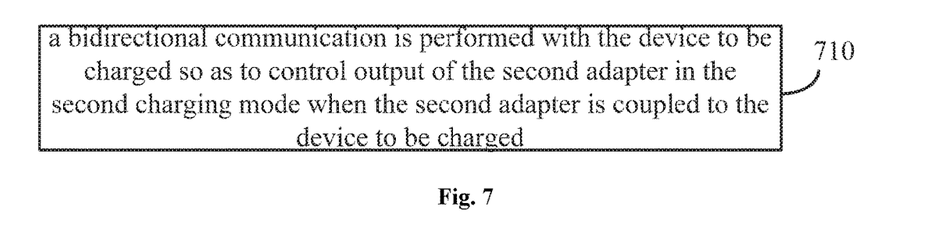
FIG. 7 is a flow chart of a charging control method according to embodiments of the present disclosure.

FIG. 7 is a flow chart of a charging control method according to embodiments of the present disclosure. The method in FIG. 7 may be performed by the second adapter as described above. In detail, the second adapter is configured to support a first charging mode and a second charging mode. A charging speed at which the second adapter charges a device to be charged in the second charging mode is faster than a charging speed at which the second adapter charges the device to be charged in the first charging mode. The second adapter is configured to charge the device to be charged by using a constant current mode in the second charging mode.

The method of FIG. 7 may include the followings.

At block 710, a bidirectional communication is performed with the device to be charged so as to control output of the second adapter in the second charging mode when the second adapter is coupled to the device to be charged.

In some embodiments, performing a bidirectional communication with the device to be charged so as to control output of the second adapter in the second charging mode may include: performing by a control unit the bidirectional communication with the device to be charged so as to negotiate about a charging mode between the second adapter and the device to be charged.

In some embodiments, performing the bidirectional communication with the device to be charged so as to negotiate about a charging mode between the second adapter and the device to be charged may include: sending a first instruction to the device to be charged, the first instruction being configured to query the device to be charged whether to start the second charging mode; receiving a first reply instruction sent by the device to be charged, the first reply instruction being configured to indicate whether the device to be charged agrees to start the second charging mode; and charging the device to be charged in the second charging mode when the device to be charged agrees to start the second charging mode.

In some embodiments, performing a bidirectional communication with the device to be charged so as to control output of the second adapter in the second charging mode may include: performing the bidirectional communication with the device to be charged so as to determine a charging voltage outputted by the second adapter in the second charging mode for charging the device to be charged; and adjusting voltage outputted by the second adapter, such that the voltage outputted by the second adapter is equal to the charging voltage outputted by the second adapter in the second charging mode for charging the device to be charged.

In some embodiments, performing the bidirectional communication with the device to be charged so as to determine a charging voltage outputted by the second adapter in the second charging mode for charging the device to be charged may include: sending a second instruction to the device to be charged, the second instruction being configured to query whether the voltage outputted by the second adapter is suitable for a present voltage of a battery of the device to be charged; and receiving a second reply instruction sent by the device to be charged, the second reply instruction being configured to indicate that the voltage outputted by the second adapter is suitable, high or low.

In some embodiments, performing a bidirectional communication with the device to be charged so as to control output of the second adapter in the second charging mode may include: performing the bidirectional communication with the device to be charged so as to determine a charging current outputted by the second adapter in the second charging mode for charging the device to be charged; and adjusting current outputted by the second adapter, such that the current (or peak value of the current) outputted by the second adapter is equal to the charging current outputted by the second adapter in the second charging mode for charging the device to be charged.

In some embodiments, performing the bidirectional communication with the device to be charged so as to determine a charging current outputted by the second adapter in the second charging mode for charging the device to be charged may include: sending by the control unit a third instruction to the device to be charged, the third instruction being configured to query a maximum charging current supported by the device to be charged; receiving by the control unit a third reply instruction sent by the device to be charged, the third reply instruction being configured to indicate the maximum charging current supported by the device to be charged; and determining by the control unit the charging current outputted by the second adapter in the second charging mode for charging the device to be charged according to the maximum charging current supported by the device to be charged.

In some embodiments, performing a bidirectional communication with the device to be charged so as to control output of the second adapter in the second charging mode may include: performing the bidirectional communication with the device to be charged so as to adjust the charging current outputted by the second adapter during a charging process in the second charging mode.

In some embodiments, performing the bidirectional communication with the device to be charged so as to adjust the current outputted by the second adapter may include: sending a fourth instruction to the device to be charged, the fourth instruction being configured to query a present voltage of a battery of the device to be charged; receiving a fourth reply instruction sent by the device to be charged, the fourth reply instruction being configured to indicate the present voltage of the battery of the device to be charged; and adjusting the current outputted by the second adapter according to the present voltage of the battery.

In some embodiments, the second adapter includes a charging interface, and performing the bidirectional communication with the device to be charged includes performing the bidirectional communication with the device to be charged via a data wire of the charging interface.

In some embodiments, the current and the voltage outputted by the second adapter are applied directly to two ends of a battery of the device to be charged, so as to perform a direct charging on the battery.

In some embodiments, the second adapter includes a control unit, configured to control a charging process, and the control unit is configured as a micro control unit.

In some embodiments, the second adapter includes a charging interface, and the charging interface is configured as a universal serial bus.

It is to be understood that, the first adapter and the second adapter herein are for convenience of description only and are not intended to be limiting of the particular type of adapter of the embodiments of the present disclosure.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present invention.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in an electrical, mechanical or other manner.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An adapter, comprising:
a primary unit, configured to convert an input alternating current into a first current with a first pulsating waveform, wherein the adapter is configured to be capable of operating in a constant current mode, and a peak value of the first current is greater than a current value corresponding to a current limiting point of the constant current mode;
a power adjustment unit, configured to sample current outputted by the adapter to obtain a current sampling value and to module the first current according to the current sampling value; and
a secondary unit, configured to convert current coupled from the primary unit to the secondary unit into the current outputted by the adapter, wherein the current outputted by the adapter is a second current with a second pulsating waveform, and a peak value of the second current is equal to the current value corresponding to the current limiting point of the constant current mode.

2. The adapter according to claim 1, wherein the second pulsating waveform represents at least one of a complete pulsating waveform and a pulsating waveform obtained after a peak clipping processing.

3. The adapter according to claim 1, wherein the adapter is configured to support a first charging mode and a second charging mode, a charging speed of the adapter in the second charging mode is faster than that in the first charging mode, the adapter is configured to charge a device to be charged by using the constant current mode in the second charging mode, the adapter further comprises a control unit, and when the adapter is coupled to the device to be charged, the control unit is configured to perform a bidirectional communication with the device to be charged so as to control output of the adapter in the second charging mode.

4. The adapter according to claim 3, wherein when the control unit performs the bidirectional communication with the device to be charged so as to control the output of the adapter in the second charging mode, the control unit is configured to:
perform the bidirectional communication with the device to be charged so as to negotiate about a charging mode between the adapter and the device to be charged.

5. The adapter according to claim 4, wherein when the control unit performs the bidirectional communication with the device to be charged so as to negotiate about the charging mode between the adapter and the device to be charged, the control unit is configured to:
send a first instruction to the device to be charged, the first instruction being configured to query the device to be charged whether to start the second charging mode;
receive a first reply instruction sent by the device to be charged, the first reply instruction being configured to indicate whether the device to be charged agrees to start the second charging mode; and
charge the device to be charged in the second charging mode when the device to be charged agrees to start the second charging mode.

6. The adapter according to claim 3, wherein when the control unit performs the bidirectional communication with the device to be charged so as to control the output of the adapter in the second charging mode, the control unit is configured to:
perform the bidirectional communication with the device to be charged so as to determine a charging voltage outputted by the adapter in the second charging mode for charging the device to be charged; and adjust voltage outputted by the adapter, such that the voltage outputted by the adapter is equal to the charging voltage outputted by the adapter in the second charging mode for charging the device to be charged.

7. The adapter according to claim 6, wherein when the control unit performs the bidirectional communication with the device to be charged so as to determine the charging voltage outputted by the adapter in the second charging mode for charging the device to be charged, the control unit is configured to:
send a second instruction to the device to be charged, the second instruction being configured to query whether the voltage outputted by the adapter is suitable for a present voltage of a battery of the device to be charged; and
receive a second reply instruction sent by the device to be charged, the second reply instruction being configured to indicate that the voltage outputted by the adapter is suitable, high or low.

8. The adapter according to claim 3, wherein when the control unit performs the bidirectional communication with the device to be charged so as to control the output of the adapter in the second charging mode, the control unit is configured to:
perform the bidirectional communication with the device to be charged so as to determine a charging current outputted by the adapter in the second charging mode for charging the device to be charged; and
adjust current outputted by the adapter, such that the current outputted by the adapter is equal to the charging current outputted by the adapter in the second charging mode for charging the device to be charged.

9. The adapter according to claim 8, wherein when the control unit performs the bidirectional communication with the device to be charged so as to determine the charging current outputted by the adapter in the second charging mode for charging the device to be charged, the control unit is configured to:
send a third instruction to the device to be charged, the third instruction being configured to query a maximum charging current supported by the device to be charged;
receive a third reply instruction sent by the device to be charged, the third reply instruction being configured to indicate the maximum charging current supported by the device to be charged; and
determine the charging current outputted by the adapter in the second charging mode for charging the device to be charged according to the maximum charging current supported by the device to be charged.

10. The adapter according to claim 3, wherein when the control unit performs the bidirectional communication with the device to be charged so as to control the output of the adapter in the second charging mode, the control unit is configured to:
perform the bidirectional communication with the device to be charged so as to adjust the current outputted by the adapter during a charging process in the second charging mode.

11. The adapter according to claim 10, wherein when the control unit performs the bidirectional communication with the device to be charged so as to adjust the current outputted by the adapter, the control unit is configured to:
send a fourth instruction to the device to be charged, the fourth instruction being configured to query a present voltage of a battery of the device to be charged;
receive a fourth reply instruction replying the fourth instruction sent by adapter, the fourth reply instruction being configured to indicate the present voltage of the battery of the device to be charged; and
adjust the current outputted by the adapter according to the present voltage of the battery.

12. The adapter according to claim 3, further comprising:
a charging interface, wherein the control unit is configured to perform the bidirectional communicate with the device to be charged via a data wire of the charging interface, wherein the charging interface is configured as a universal serial bus interface.

13. The adapter according to claim 1, wherein the current and the voltage outputted by the adapter are applied directly to two ends of a battery of the device to be charged, so as to perform a direct charging on the battery.

14. A charging control method, applied in an adapter, wherein the adapter comprises:
a primary unit, configured to convert an input alternating current into a first current with a first pulsating waveform, wherein the adapter is configured to be capable of operating in a constant current mode, and a peak value of the first current is greater than a current value corresponding to a current limiting point of the constant current mode;
a power adjustment unit, configured to sample current outputted by the adapter to obtain a current sampling value and to module the first current according to the current sampling value; and
a secondary unit, configured to convert current coupled from the primary unit to the secondary unit into the current outputted by the adapter, wherein the current outputted by the adapter is a second current with a second pulsating waveform, and a peak value of the second current is equal to the current value corresponding to the current limiting point of the constant current mode;
wherein the adapter is configured to support a first charging mode and a second charging mode, a charging speed of the adapter in the second charging mode is faster than that in the first charging mode, the adapter is configured to charge the device to be charged by using a constant current mode in the second charging mode, and the method comprises:
performing a bidirectional communication with the device to be charged so as to control output of the adapter in the second charging mode when the adapter is coupled to the device to be charged.

15. The method according to claim 14, wherein performing a bidirectional communication with the device to be charged so as to control output of the adapter in the second charging mode, comprises:
performing, by a control unit, the bidirectional communication with the device to be charged so as to negotiate about a charging mode between the adapter and the device to be charged.

16. The method according to claim 15, wherein performing the bidirectional communication with the device to be charged so as to negotiate about a charging mode between the adapter and the device to be charged, comprises:
sending a first instruction to the device to be charged, the first instruction being configured to query the device to be charged whether to start the second charging mode;
receiving a first reply instruction sent by the device to be charged, the first reply instruction being configured to indicate whether the device to be charged agrees to start the second charging mode; and charging the device to be charged in the second charging mode when the device to be charged agrees to start the second charging mode.

17. The method according to claim 14, wherein performing a bidirectional communication with the device to be charged so as to control output of the adapter in the second charging mode, comprises:
performing the bidirectional communication with the device to be charged so as to determine a charging voltage outputted by the adapter in the second charging mode for charging the device to be charged; and
adjusting voltage outputted by the adapter, such that the voltage outputted by the adapter is equal to the charging voltage outputted by the adapter in the second charging mode for charging the device to be charged.

18. The method according to claim 17, wherein performing the bidirectional communication with the device to be charged so as to determine charging voltage outputted by the adapter in the second charging mode for charging the device to be charged, comprises:
sending a second instruction to the device to be charged, the second instruction being configured to query whether the voltage outputted by the adapter is suitable for a present voltage of a battery of the device to be charged; and
receiving a second reply instruction sent by the device to be charged, the second reply instruction being configured to indicate that the voltage outputted by the adapter is suitable, high or low.

19. The method according to claim 14, wherein performing a bidirectional communication with the device to be charged so as to control output of the adapter in the second charging mode, comprises:
performing the bidirectional communication with the device to be charged so as to determine a charging current outputted by the adapter in the second charging mode for charging the device to be charged; and
adjusting current outputted by the adapter, such that the current outputted by the adapter is equal to the charging current outputted by the adapter in the second charging mode for charging the device to be charged.

20. A charging System, comprising:
a device to be charged;
an adapter,
wherein the adapter is configured to support a first charging mode and a second charging mode, a charging speed of the adapter in the second charging mode is faster than that in the first charging mode, the adapter is configured to charge the device to be charged by using a constant current mode in the second charging mode;
wherein the adapter comprises:
a primary unit, configured to convert an input alternating current into a first current with a first pulsating waveform, wherein the adapter is configured to be capable of operating in a constant current mode, and a peak value of the first current is greater than a current value corresponding to a current limiting point of the constant current mode; a power adjustment unit, configured to sample current outputted by the adapter to obtain a current sampling value and to module the first current according to the current sampling value; a secondary unit, configured to convert current coupled from the primary unit to the secondary unit into the current outputted by the adapter, wherein the current outputted by the adapter is a second current with a second pulsating waveform, and a peak value of the second current is equal to the current value corresponding to the current limiting point of the constant current mode; a charging interface; and a control unit, configured to perform a bidirectional communication with the device to be charged via a data wire of the charging interface so as to control output of the adapter in the second charging mode.

* * * * *